United States Patent [19]

Cook

[11] Patent Number: 4,633,030

[45] Date of Patent: Dec. 30, 1986

[54] PHOTOVOLTAIC CELLS ON LATTICE-MISMATCHED CRYSTAL SUBSTRATES

[75] Inventor: Melvin S. Cook, Saddle River, N.J.

[73] Assignee: Holobeam, Inc., Ridgewood, N.J.

[21] Appl. No.: 762,200

[22] Filed: Aug. 5, 1985

[51] Int. Cl.[4] .................. H01L 31/06; H01L 25/02; H01L 27/14

[52] U.S. Cl. .................. 136/246; 136/244; 136/249; 136/255; 136/256; 136/257; 136/261; 136/262

[58] Field of Search ............. 136/244, 246, 249 TJ, 136/249 MS, 255, 256, 261, 262, 257; 357/30

[56] References Cited

U.S. PATENT DOCUMENTS

| | | | |
|---|---|---|---|
| 3,977,904 | 8/1976 | Köhler | 136/246 |
| 4,295,002 | 10/1981 | Chappell et al. | 136/244 |
| 4,328,389 | 5/1982 | Stern et al. | 136/246 |
| 4,451,691 | 5/1984 | Fraas | 136/249 TJ |
| 4,479,027 | 10/1984 | Todorof | 136/249 TJ |

FOREIGN PATENT DOCUMENTS

| | | | |
|---|---|---|---|
| 2472146 | 6/1981 | France | 136/248 |
| 55-141764 | 11/1980 | Japan | 136/246 |

OTHER PUBLICATIONS

H. Sakaki et al., *Jap. J. Appl. Phys.*, vol. 20, (1981), Supplement 20-2, pp. 127-133.

*Primary Examiner*—Aaron Weisstuch
*Attorney, Agent, or Firm*—Gottlieb, Rackman & Reisman

[57] ABSTRACT

A photovoltaic cell formed on a crystal substrate in which the lattice constant of the material of which the substrate is composed differs from the lattice constant of crystal material of which at least one component cell is composed. A lattice-graded bridging epilayer is formed over curved surface regions of the crystal substrate.

32 Claims, 7 Drawing Figures

PHOTOVOLTAIC CELLS ON LATTICE-MISMATCHED CRYSTAL SUBSTRATES

This invention relates to photovoltaic cells with a high efficiency for the conversion of sunlight to electricity which include regions of materials that are mismatched in lattice constant ("lattice-mismatched") to the crystal substrates on which the photovoltaic cells are formed and particularly to such devices that incorporate an epitaxial layer ("epilayer") of material that is graded in lattice constant ("lattice-graded") from an initial value to a final value differing from this initial value.

Photovoltaic cells with a high efficiency for the conversion of sunlight to electricity are generally formed on crystal substrates. The availability of low-cost crystal substrates suitable for this purpose is thus of importance for such devices. Crystal substrates composed of compound semiconductor materials are expensive and are generally available only in small size wafers with mediocre crystal quality. Silicon substrates can be obtained in large sizes with good crystal quality at a low cost as compared to substrates composed of compound semiconductor materials. However, the efficiency of a photovoltaic cell formed of crystal silicon is limited by the less-than-ideal match of the energy bandgap value of silicon to the solar spectrum, and silicon substrates cannot be used to grow most semiconductor crystal materials of interest for forming photovoltaic cells because of severe lattice-mismatch of silicon to these materials.

It is possible in principle to form a multijunction photovoltaic cell by combining a set of single-junction photovoltaic cells. Each single-junction photovoltaic cell would then be a component photovoltaic cell ("component cell") of the multijunction device. If the component cells were in series optically, each would absorb that portion of the radiation transmitted to it having photon energies equal to or greater than the energy bandgap of its constituent material and would transmit the residue to the component cells following in the optical path. If the energy bandgap values of the component cells were distributed well with respect to the spectrum of the incident radiation, the multijunction cell could have a high conversion efficiency.

The cost of crystal substrates is an important part of the cost of photovoltaic cells formed on them. Therefore, the cost of a multijunction photovoltaic cell can be reduced if its component cells are all formed on a single crystal substrate, that is, if it is a monolithic multijunction photovoltaic cell. However, technical problems have impeded the successful development of such a monolithic multijunction photovoltaic cell.

These technical problems typically fall into various categories. For example, if two or more component cells are connected in series electrically, the photocurrents generated in each of these cells must be equal or the overall conversion efficiency of the multijunction device will be reduced as a result of this inequality. Further, if a given crystal material is grown over a different crystal material while preserving good crystal quality, the two materials must have crystal structures and lattice constants which are compatible for this purpose or else an intervening bridging epilayer must be grown between them which is grown starting with an initial compatible value of the lattice constant which allows it to be grown with good crystal quality over the underlying material and ending with a final compatible value of lattice constant which allows the other crystal material to be grown over it with good crystal quality. In the latter case, if radiation important to device efficiency must pass through this bridging lattice-graded layer, then it must be optically transparent to such radiation or the conversion efficiency of the monolithic multijunction photovoltaic cell will fall as a consequence of absorption of such radiation. Both of these alternatives have been difficult to achieve with a low-cost crystal substrate. Another problem has involved the formation of low-ohmic-value interconnections between component cells that are in series electrically since it is difficult to form metal interconnections between component cells that are in series both electrically and optically, and it is very difficult to form tunnel junction interconnections in high energy bandgap semiconductor materials such as are typically required for reasons of optical transparency.

In my copending U.S. patent application, Ser. No. 696,438, filed on Jan. 20, 1985, now U.S. Pat. No. 4,548,658, entitled "GROWTH OF LATTICE-GRADED EPILAYERS", a method is disclosed for growing epilayers of lattice-graded materials having structures belonging to the cubic crystal system on crystal substrates having structures belonging to the cubic crystal system by growing these epilayers on curved-surface regions of the substrates. Materials having structures belonging to the cubic crystal system include such diamond structure materials as silicon and germanium and such zinc blende materials as gallium phosphide, gallium aluminum arsenide, indium phosphide, and cadmium telluride, among-others. In this method, when the lattice constant is to be increased from a first lattice constant to a second lattice constant, a lattice-graded epilayer is grown on convex-shaped regions of a substrate starting with a value of lattice constant which is compatible with the substrate surface on which it is grown such that good crystal quality is maintained and ending with a value of lattice constant which is compatible with the material to be grown over the lattice-graded epilayer so that this material can be grown over the lattice-graded layer while maintaining good crystal quality. That is, the lattice-graded epilayer is grown starting with an initial compatible value and ending with a final compatible value. On the other hand, when the lattice constant is to be decreased from an initial lattice constant to a final lattice constant, the lattice-graded epilayer is grown over concave-shaped regions of a substrate starting with an initial compatible value and ending with a final compatible value. For example, a lattice-graded epilayer of germanium-silicon alloy can be grown on convex-shaped regions of a silicon substrate, starting with silicon which has a lattice constant of 5.431 Angstroms and ending with germanium which has a lattice constant of 5.657 Angstroms. Gallium arsenide can be grown over a germanium surface while maintaining good crystal quality since germanium has a lattice constant with a compatible value for the growth of gallium arsenide. If the lattice constant is to be increased to larger values, the lattice-graded growth can be continued over the gallium arsenide while using compound semiconductor materials, e.g., the GaInAsP family of compounds.

Preferably, the curved-surface regions on which the lattice-graded epilayer is grown and the surfaces of the growing epilayer conform well to portions of spherical surfaces of radii R that vary during the growth. As described in U.S. Pat. No. 4,548,658, if R is $R_1$ at time $T_1$ during the growth and is $R_2$ at time $T_2$, then if the lattice constant is being increased it is preferable that:

$R_1/R_2 \leq a_1/a_2$, and if the lattice constant is being decreased, it is preferable that:

$R_1/R_2 \geq a_1/a_2$, where $a_1$ and $a_2$ are the values of the lattice constants on the surfaces of the growing epilayer at times $T_1$ and $T_2$, respectively.

If a component cell is located on each side of the lattice-graded epilayer, and if these component cells are in series optically, then the materials of which the lattice-graded epilayer is composed must allow radiation of importance for efficient operation of the component cell which receives radiation transmitted through the lattice-graded epilayer to pass with little or no attenuation by the epilayer in order for efficient operation of the multijunction cell to be possible. For example, if the lattice-graded epilayer were composed of germanium-silicon alloy, the strong absorption of radiation over important regions of the spectrum by germanium would have a detrimental effect on the efficiency of a multijunction cell if the epilayer were disposed between two component cells of the multijunction device, one of which is illuminated by radiation passed through the other. That is, the strong absorption of radiation by the germanium-silicon alloy would prevent the component cells in question from being operated in series optically since it is not transparent optically to radiation of importance for efficient operation.

The curved-surface regions on which the lattice-graded epilayer is grown are an ordered plurality of curved surface regions. They are not accidental microscopic irregularities of the surface on which they are present but are deliberately formed for the purpose of growing a lattice-graded epilayer. Many such curved-surface regions are involved, thus there is a plurality of curved-surface regions, and since they are formed as an ordered group, there is an ordered plurality of curved-surface regions on which the lattice-graded epilayer is grown.

As used in the present application, the term "crystal" is taken to mean both single-crystal and multi-crystal as applied to materials. Thus, a crystal substrate can be either a single-crystal substrate or a multi-crystal substrate. It is well-known in the art, however, that it is generally preferable to use single-crystal materials or multi-crystal materials with as few single-crystal constituents as possible for reasons of maximizing the efficiency and performance of devices made from the crystal materials in question.

Spectrum-splitting mirrors split incident radiation into two or more portions with the division being based on the wavelengths of the radiation. Typically, one or more portions pass through the spectrum-splitting mirror and one or more portions are reflected from the mirror. Such mirrors can be formed by techniques well-known in the art. For example, it may be formed by depositing a periodic succession of dichroic layers on a substratum, where the indices of refraction of these layers alternates between two or more values. Reflection is maximized or minimized depending on whether the optical path is close to a succession of half-wave or quarter-wave segments. If the photovoltaic cells have different component cells adjacent to each of their faces, spectrum-splitting mirrors can be used to divide incident radiation into two or more portions based on intensity and wavelength regions. Each such portion can be directed to incidence on different faces of the cells. The net result can be a higher overall conversion of radiation to electricity since the component cells can be optimized to respond to a narrow range of photon energies rather than to the entire range of photon energies of the incident radiation.

In the case of an array of multijunction photovoltaic cells, the cost of crystal substrates and, when they are used, spectrum-splitting mirrors are important parts of the total cost of the array. The contribution of such cost elements can result in a build-up of the total cost to the point where the array can lose economic feasibility for some applications. This conclusion is also true for the case of arrays which include means for concentrating incident radiation before it is directed to incidence on the photovoltaic cells.

It is an object of the present invention to provide a photovoltaic cell formed of crystal material on a crystal substrate to which the crystal material is lattice-mismatched.

It is another object of the present invention to provide a monolithic multijunction photovoltaic cell formed on a crystal substrate which is lattice-mismatched to crystal material incorporated in component cells of the monolithic device.

It is a further object of the present invention to provide an array of monolithic multijunction photovoltaic cells.

It is also an object of the present invention to provide a concentrator system incorporating an array of monolithic multijunction photovoltaic cells.

Briefly, in accordance with the principles of my invention and in the preferred embodiment thereof, a flat surface is formed on the first side of a silicon crystal substrate and an ordered plurality of convex-shaped regions separated by flat regions are formed on the second side of the substrate. The substrate consists of p-type silicon with an acceptor concentration which may be in the range $10^{16}$–$10^{17}$ cm$^{-3}$, for example.

A 0.5 micrometer thick layer of p$^+$-type silicon is formed on the second side of the substrate. The flat regions on the second side of the substrate are then covered with a 0.3 micrometer thick layer of silicon dioxide or other material on which nucleation of material during successive growth process that will be involved is not a favored process. (If such undesired nucleation does occur, the material that grows on this layer can be removed, e.g., by etching it off.)

The lattice constant of a germanium-silicon alloy such as $Ge_xSi_{1-x}$ is a function of the relative amounts of germanium and silicon, i.e., of the value of x. This alloy can be grown with a lattice constant ranging from that of silicon (5.431 Angstroms) to that of germanium (5.657 Angstroms). Such a growth can cover this full range of lattice constants starting from that of silicon and ending with that of germanium by using the thermal decomposition of a mixture of $SiH_4$ and $GeCl_4$, starting the growth with $SiH_4$ at a temperature of 1100° C. and gradually introducing $GeCl_4$ and increasing its presence in the mixture until only $GeCl_4$ is present when the growth ends at a temperature of 850° C., as is well-known in the art.

A lattice-graded epilayer of germanium-silicon alloy is grown over the convex-shaped regions, starting with silicon and ending the growth with germanium. As explained in Ser. No. 696,438 and briefly mentioned above, the thickness of the lattice-graded epilayer is related to the initial shape of the convex-shaped regions. This epilayer is grown as p-type material. The acceptor concentration in the lattice-graded epilayer may be in the range $10^{16}$–$10^{17}$ cm$^{-3}$ in a typical case.

A thin, e.g., 0.5–2.0 micrometer thick, epilayer of p$^+$-type material with an acceptor concentration in the range $10^{19}$–$2\times10^{19}$ cm$^{-3}$, for example, of germanium is then grown over the germanium surface of the lattice-graded epilayer. This latter epilayer will form part of a tunnel junction. A thin, e.g., 0.5–2.0 micrometer thick, epilayer of n$^+$-type gallium arsenide with a donor concentration in the range of, for example, $5\times10^{18}$–$2\times10^{19}$ cm$^{-3}$ is then grown over the p$^+$-type epilayer of germanium, thus forming the other side of the tunnel junction. Such degeneratively-doped tunnel junctions to interconnect two regions of semiconductor material are well-known in the art. Some of the dopants required to establish the desired donor and acceptor concentrations in the tunnel junction will result from the diffusion of arsenic into the germanium, as is well-known in the art. The diffusion of germanium into the epilayers grown over the lattice-graded epilayer can be minimized by the use of a technique capable of promoting a rapid epilayer growth rate such as is described in my copending application Ser. No. 531,230 filed Sept. 12, 1983, now U.S. Pat. No. 4,597,823 issued July 1, 1986, and entitled RAPID LPE CRYSTAL GROWTH.

The members of the gallium aluminum arsenide family of compounds all have similar lattice constants and are compatible in the sense that one member of this family can be grown over another member of this family while preserving good crystal quality. The range of direct energy bandgaps covered by this family is 1.4–1.9 eV.

A thin, e.g., 0.5 micrometer thick epilayer of Ga$_{0.5}$Al$_{0.5}$As composed of n$^+$-type material is then grown over the gallium arsenide epilayer. This epilayer will develop an electric field in a compound semiconductor component cell formed over this epilayer in order to reflect minority carriers towards the junction of this component cell. The donor concentration of this epilayer may fall in the range $10^{18}$–$2\times10^{18}$ cm$^{-3}$, for example.

An 8 micrometer thick epilayer of n-type Ga$_{0.7}$Al$_{0.3}$As is then grown over the Ga$_{0.5}$Al$_{0.5}$As epilayer. The Ga$_{0.7}$Al$_{0.3}$As epilayer may be doped to a donor concentration falling in the range $10^{16}$–$5\times10^{17}$ cm$^{-3}$, for example.

A thin, e.g. 0.3 micrometer thick, epilayer of p$^+$-type Ga$_{0.7}$Al$_{0.3}$As is then grown over the n.type epilayer of Ga$_{0.7}$Al$_{0.3}$As, thus forming a p/n junction. The acceptor concentration in this epilayer may fall in the range $10^{19}$–$2\times10^{19}$ cm$^{-3}$, for example.

A thin, e.g., 0.5 micrometer thick, layer of n$^+$-type silicon is then formed over the p-type silicon on the first side of the silicon crystal substrate, thus forming an n/p junction. The donor concentration in this layer may fall in the range $10^{19}$–$2\times10^{19}$ cm$^{-3}$, for example.

During the growth of the GaAlAs epilayers, some lateral growth over the surface of the SiO$_2$ layer may occur. This is beneficial in that it tends to increase the active area of the component cell formed in the GaAlAs material. Such lateral overgrowth is well-known in the art. Since the rate of epilayer growth is a function of the crystal orientation of the surface on which the growth occurs, by choosing an appropriate crystal orientation for the crystal substrate, e.g. the (100) orientation, the surface of the GaAlAs epilayer can be smoother than that of the second side of the substrate on which the lattice-graded epilayer is grown. Such a result may occur during the growth of the lattice-graded epilayer itself, and the initial shape of the convex-shaped regions and the thickness of the lattice-graded epilayer must reflect such considerations, as is obvious to one skilled in the art.

Techniques for forming layers of crystal material are well-known in the art. For example, chemical vapor deposition or liquid phase epitaxy may be used for that purpose.

N-type and p-type dopants are well-known in the art. For example, n-type dopants for silicon and germanium include, among others, antimony, phosphorus, and arsenic. P-type dopants for silicon and germanium include, among others, gallium, aluminum, and boron. N-type dopants for the III-V family of semiconductors include, among others, tin, tellurium, and sulfur, and p-type dopants for the III-V family of semiconductors include, among others, zinc and magnesium.

Front electrodes are then formed on the surface of the n$^+$-type silicon layer and on the surface of the p$^+$-type layer of Ga$_{0.7}$Al$_{0.3}$As. Typically, a front electrode covers approximately 7 percent of the area of the layer on which it is formed. A front electrode may consist of a number of grid lines connected by a bus. Techniques are well-known in the art for forming such electrodes over selected portions of a substrate. Ag-Zn can be used for the electrode on the p$^+$-type compound semiconductor, and Ti/Pd/Ag can be used for the electrode on the n$^+$-type silicon, as is well-known in the art.

The monolithic multijunction cell thus formed can be protected from degradation due to exposure to the environment by encapsulating it. Such encapsulation is well-known in the art. Antireflection coatings can be formed on the cell faces, that is, on the surfaces of the monolithic cell on which radiation is incident, in order to minimize efficiency loss from reflections.

The monolithic cell of the preferred embodiment incorporates two component cells electrically connected by a tunnel junction. These two component cells are not operated in series optically due to the strong radiation absorption by the lattice-graded layer. In operation, incident radiation is divided into first radiation and second radiation. The silicon component cell is illuminated by the first radiation incident on the adjacent first face of the monolithic cell, and the compound semiconductor component cell is illuminated by the second radiation incident on the second face of the monolithic cell. Typically, the first and the second radiations will differ in intensity and wavelength regions, although they may overlap somewhat in wavelength regions.

In the cell of the preferred embodiment, the two component cells are in series electrically although they are not in series optically. External electrical connections are made to the front electrodes of the two component cells, thus forming a two-terminal cell. The conversion efficiency of a multijunction cell suffers when the photocurrents that would be generated in its component cells in the absence of electrical connection between them are unequal if these component cells are actually connected in series electrically. If the magnitudes of the photocurrents that would be generated in the absence of such electrical connection differ by more than 25 percent, then it may be considered to result in excess loss of efficiency when the component cells in question are actually connected electrically in series.

The convention will be adopted for the purposes of the present application that when two or more component cells are connected electrically in series it will be explicitly understood that what is meant when the photocurrents generated in these component cells are described are those photocurrents that would be generated by the radiations illuminating these component cells if they were not connected electrically to each other.

Close correspondence of the photocurrents generated in the two component cells of the multijunction cell of the preferred embodiment can be achieved by adjusting the intensity and wavelength regions of each of the first and second radiations that are directed to the faces of the multijunction cell.

Various means can be used to divide incident radiation into first and second radiations and to direct them to the faces of the cell. If the multijunction cells are used to form an array, a spectrum-splitting mirror can be formed on each first face which would pass first radiation through to the underlying silicon component cell and would reflect second radiation onto the second face of an adjacent cell of the array, through which it would pass to the underlying compound semiconductor component cell. The tunnel junction of the cell of the preferred embodiment incorporated materials that absorbed radiation strongly. However, high doping levels can be achieved in these materials, thus making an efficient tunnel junction possible. The tunnel junction could be formed of germanium and GaAs or GaAs, as is obvious to one skilled in the art. The actual materials choice was made because of the diffusions of materials into the layers composing the tunnel junction which were mentioned.

In a particular example of the preferred embodiment, the convex-shaped regions conform well to portions of spherical surfaces with radii 50 micrometers that intercept the flat regions on the second side of the substrate at circles of diameter 30 micrometers that are separated from each other by center-to-center separations of 45 micrometers. The convex-shaped regions can be formed by first forming an ordered plurality of SiO2 circles on a flat substrate surface. An anisotropic etching solution would be used to etch the flat regions and to undercut the substrate under the SiO2 circles to form the convex-shaped regions. Techniques well-known in the art can be used to form the SiO2 circles, e.g., photolithographic techniques can be used. In a particular case, if the silicon substrate has a (100) orientation, a suitable anisotropic etching solution can be used to form the convex-shaped regions by undercutting the substrate under the SiO2 circles. The relative etching rates can be varied by varying the proportions of the ingredients in the etching solution. The SiO2 circles will be detached from the substrate as a result of this undercutting action or can be removed by the use of HF solution. The thickness of the lattice-graded $Ge_xSi_{1-x}$ layer will vary with its crystal orientation due to different rates of growth.

Further objects, features, and advantages of my invention will become apparent upon consideration of the following detailed description in conjunction with the drawing, in which.

Figure 1:
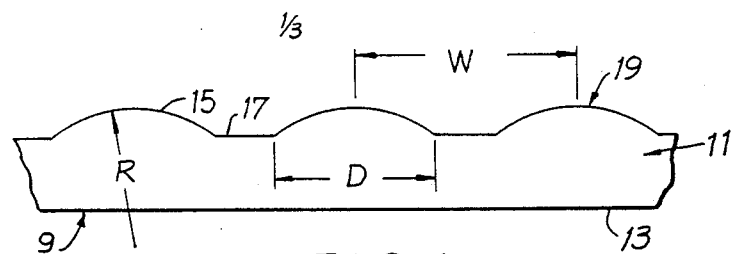
FIG. 1 is a view in section of a portion of a crystal substrate with a first flat side and a second side with convex-shaped regions separated by flat regions.

P/n and n/p junctions will be decribed in the embodiments shown in the drawing. However, it will be apparent to one skilled in the art that other types of junctions can be used. For example, Schottky junctions or metal-insulator-semiconductor type junctions, among others, can be used to separate the charge carriers generated by the absorption of radiation in the photovoltaic cells.

It will be assumed in discussing the embodiments of the invention shown in the drawing that p-type crystal substrates are used. However, it will be obvious to one skilled in the art that n-type substrates can be used if appropriate adjustments are made in the conductivity types, in the sense of p-type versus n-type materials, of the other portions of the cells.

Typical layer thicknesses will be described and typical dopant concentrations will be disclosed. However, it will be obvious to one skilled in the art that other layer thicknesses and dopant concentrations can be used without departing from the spirit and the scope of the present invention. The values that will be given should be regarding as merely provided for illustrative purposes since it is well-known in the art that wide variations in such matters are possible without introducing new matters or other novelty.

In FIG. 1, a view in section is shown of a portion of crystal substrate 11. The substrate has flat surface 13 on first side 9, and has convex-shaped regions 15 separated by flat regions 17 on its second side 19. The convex-shaped regions and the flat regions on the second side of the substrate can be formed using techniques well-known in the art. For example, silicon dioxide can be formed on a flat surface and the material outside an ordered plurality of circles etched away using photolithographic techniques and etchants. An anisotropic etching solution can then be used to form the flat regions and, by undercutting the silicon dioxide circles, to form the convex-shaped regions. Alternatively, a light-assisted etching process can be used to form the convex-shaped regions 15 and the flat region 17.

Preferably, the convex-shaped regions intercept the flat regions at circles (not shown in FIG. 1) of diameter D having center-to-center separations of W. Typically, the maximum radius to which portions of the convex-shaped regions conform is less than 200 micrometers, D is less than 75 micrometers, and W is less than D plus 40 micrometers, although in particular cases values for these parameters may be used which lie outside these ranges, if desired.

Crystal substrates used in forming photovoltaic cells according to the teachings of the present application are assumed to be composed of crystal materials having structures belonging to the cubic crystal system. Epilayers grown during the forming of the photovoltaic cells disclosed in the present application are assumed to be composed of crystal materials having structures belonging to the cubic crystal system. Therefore, since it is to be used in forming photovoltaic cells according to the teachings of the present application, substrate 11 is composed of crystal material having a structure belonging to the cubic crystal system.

Figure 2:
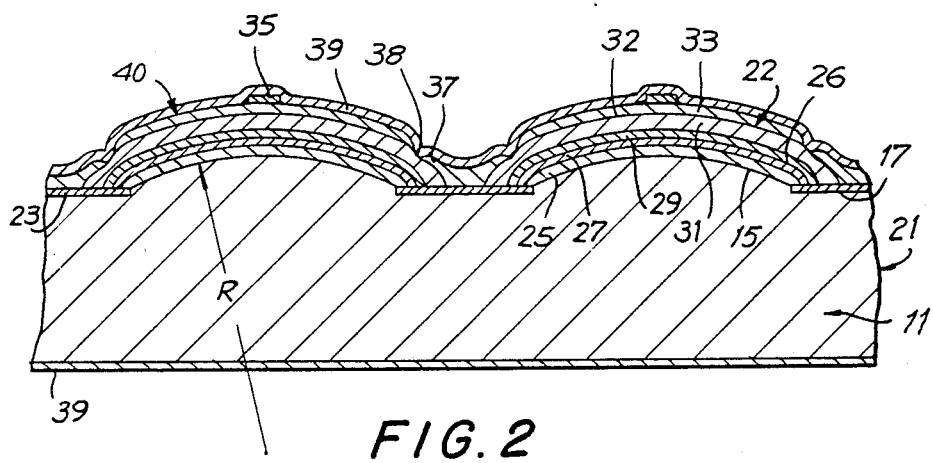
FIG. 2 is an enlarged view in section of a single-junction photovoltaic cell with a component cell formed of crystal material having a larger value of lattice constant than that of the crystal substrate on which it is formed.

In FIG. 2, an enlarged view in section is shown of a portion of a single-crystal photovoltaic cell 21 that incorporates component cell 22. Component cell 22 includes crystal material having a larger lattice constant than the lattice constant of the substrate.

It is often desirable to form a photovoltaic cell with a component cell incorporating crystal material having properties which differ from those of the crystal material of which the substrate is composed. For example, if the substrate is composed of crystal silicon, then there are compound semiconductor materials which possess energy bandgap values that provide a better match to the solar spectrum for the purposes of forming a photovoltaic cell with high conversion efficiency than does silicon. However, if a crystal silicon substrate is used in forming a photovoltaic cell which incorporates a component cell composed of such a compound semiconductor material, in order to preserve good crystal quality either a compound semiconductor material which is lattice-matched to silicon must be employed or a lattice-graded bridging epilayer must be grown which bridges the transition from the lattice constant of the crystal substrate to the lattice constant of the compound semiconductor material in question. Using the method disclosed in Ser. No. 696,438, if the lattice constant is to be bridged by a lattice-graded layer from an initial value of lattice constant to a final value of lattice constant differing from this initial value, the layer must be epitaxially-grown over curved-surface regions. If the lattice constant is to be increased, the bridging lattice-graded layer must be grown over convex-shaped regions, and if the lattice constant is to be decreased, the bridging lattice-graded layer must be grown over concave-shaped regions. The conditions governing the required thickness of a lattice-graded epilayer have been briefly recapitulated previously in the present application and are more fully described in U.S. Pat. No. 4,548,658.

As previously mentioned, materials exist on which nucleation of other materials of various types is not a favored process. For many of the crystal materials grown for the purposes of forming devices of the types disclosed in the present application, silicon dioxide is such a material. If any undesired nucleation does occur on such a material, the material involved can be removed selectively, e.g., by use of photolithographic techniques and etchants.

A thin, e.g., 0.2 micrometers thick, layer 23 of silicon dioxide on which nucleation is not desired is formed on the flat regions 17 of the substrate 11.

An epilayer 25 of lattice-graded material is then grown on convex-shaped regions 15. The layer 25 is grown starting with an initial value which allows material of good crystal quality to be grown, i.e., an initial compatible value, and increasing the lattice constant of this bridging lattice-graded layer until a larger value of lattice constant is achieved such that an epilayer 27 of different material can be grown on layer 25 with good crystal quality, i.e., until a final compatible value of lattice constant is achieved.

In a particular case, the substrate 11 is a silicon crystal substrate and it is desired to grow a lattice-graded layer which increases the lattice constant from that of silicon to that of gallium arsenide. Convex-shaped regions 15 are formed, and an epilayer 25 of $Ge_xSi_{1-x}$ is grown over the surface 26 of these regions, starting with an initial compatible value of lattice constant associated with x equal to zero, and ending the growth with a final compatible value of lattice constant associated with x equal to unity. Silicon is clearly compatible with a silicon substrate for growth while preserving the crystal quality of the silicon substrate, and germanium is compatible with gallium arsenide since gallium arsenide can be grown over germanium which preserving good crystal quality. Members of the gallium aluminum arsenide family all have sufficiently similar lattice constants that one member of this family can be epitaxially grown over another member of this family while preserving good crystal quality, i.e., their lattice constants are compatible with each other.

In the embodiment of the present invention shown in FIG. 2, after the lattice-graded epilayer 25 has been grown, epilayer 27 is grown over surface 26 of epilayer 25. The crystal material of which layer 27 is composed must be such that the epilayer 27 can be grown over layer 25 while preserving good crystal quality.

While the substrate and layers 25 and 27 are not part of the active portions of component cell 22 and thus their conductivity types are not important, it is often convenient to use materials for these structures which are of the same conductivity type as that of epilayer 29 which is next epitaxially grown over layer 27. The thickness of layer 29 may lie in the range 0.5–2.0 micrometers, for example, and its conductivity type is the same as that of epilayer 31 which is grown over layer 29. The function of layer 29 is to develop a back surface field in component cell 22 which reflects minority carriers towards junction 32 of the component cell 22. Epilayer 29 is typically more heavily doped than layer 31 and is, preferably, composed of material having a larger value of energy bandgap than that of layer 31 in order to effectively establish a back surface field in component cell 22. In certain cases, diffusion of material from layer 25 into the layers grown over it is a significant source of dopants for these layers. This may be utilized in the design of the photovoltaic cell. For example, in the particular case mentioned above, germanium diffusion can effectively eliminate the need for layer 29 since such diffusion can establish a dopant profile in layer 31, if layer 31 is n-type III-V compound semiconductor material, such that a back surface field is developed in layer 31 as a consequence of the germanium diffusion. Germanium in a III-V semiconductor acts as an n-type dopant, and it is thus generally preferable if a silicon substrate and a $Ge_xSi_{1-x}$ lattice-grading layer are used to form epilayers 27, 29, and 31 as n-type layers.

Epilayer 31 is grown over layer 29, and epilayer 33 is grown over layer 31. Layers 31 and 33 are composed of crystal materials having opposite conductivity types in the sense of p-type versus n-type. Layers 31 and 33 form the active portions of component cell 22. Radiation which is absorbed in the layers 31 and 33 can generate electron-hole pairs which may be separated at the junction 32 formed between these layers.

It is well-known in the art that the photocurrents generated in photovoltaic cells result from the absorption of radiation by the cell with the generation of electron-hole pairs resulting from such absorption and the separation of these electron-hole pairs at a junction of the cell. The electrons are collected at one electrode of the cell and the holes are collected at the other electrode if the cell is a two-terminal cell, for example. Such matters are well-known to one skilled in the art. In general, photocurrents result from the absorption of radiation in the active portions of photovoltaic cells. Radiation which is thus absorbed can generate hole-electron pairs only if the photon energies of the absorbed radiation are equal to or greater than the energy bandgap of the material in which the photons are absorbed. As is well-known in the art, the wavelength of radiation is directly related to the energy of its photons by the relationship $\lambda = 1.24/E$, where $\lambda$ is the wavelength of the absorbed radiation in micrometers and E is the energy of the associated photon in electron volts. Photons with energies that are less than the energy bandgap value of the semiconductor material in which thay are moving are not readily absorbed since there is no energy state available in the forbidden gap of the semiconductor to accomodate an electron, and the material will appear to be transparent to such radiation. Only when the photon energy is equal to or greater than the energy bandgap value of the semiconductor will an electron-hole pair be generated, and the excess energy of the photon above the energy bandgap value will appear as heat in the semiconductor.

In the embodiment of the present invention of FIG. 2, epilayer 29 may be, e.g., 5 micrometers thick and epilayer 33 may be, e.g., 0.5 micrometers thick. The dopant concentration in epilayer 31 may be, e.g., in the range $10^{16}$–$2 \times 10^{17}$ cm$^{-3}$, although values outside these ranges may be used if desired. Epilayer 33 is not grown over surface region 38 of epilayer 31 as rear electrode 37 will subsequently be formed over a portion of surface region 38 such that it is not in contact with layer 33 since such contact would be detrimental to the efficiency of component cell 22. The dopant concentration of layer 33 may be in the range $10^{19}$–$2 \times 10^{19}$ cm$^{-3}$ in typical cases.

If layer 33 is composed of n-type material, junction 32 is an n/p junction, and if layer 33 is composed of p-type material, junction 32 is a p/n junction. If layers 31 and 33 are composed of the same type of crystal material except for dopants then junction 32 is a homojunction, and if layers 33 and 31 are composed of different type of crystal material, junction 32 is a heterojunction, as is well-known in the art.

Front electrode 35 is then formed in contact with layer 33 and rear electrode 37 is then formed over a portion of surface region 38 in contact with layer 31. Techniques for selectively forming electrodes over portions of a surface are well-known in the art. Electrodeposition or deposition from a vapor can be used in forming the electrodes, for example.

Metallic systems which are well-known in the art can be used to form metallic electrodes. For example, Ag-Sn can be used to contact an n-type III-V semiconductor, and Ag-Zn can be used to contact a p-type III-V semiconductor, while Ti/Pd/Ag can be used to form a metallic contact to n-type silicon or germanium, and aluminum may be used to contact p-type silicon or germanium.

When forming a metallic contact to a semiconductor, particularly when the layer to which the contact is being made is a thin layer, it is often desirable to first form a capping layer on the surface of the layer, to then form the electrode on the capping layer, and to then remove the capping layer between the grid lines of the electrode. Such matters are well-known in the art. It is also known to form a layer over the cell in order to passivate the surface of the cells and to thus minimize undesirable recombination of charge carriers since such recombination reduces cell efficiency.

Radiation incident on a cell encounters the front electrode of the cell before it reaches the cell junction. If the cell has a second electrode, this second electrode is termed the rear electrode for the purposes of the present application. Thus, in FIG. 2, electrode 35 is a front electrode and electrode 37 is a rear electrode.

Typically, a front electrode is formed over about 7 percent of the layer it contacts, and in the embodiment shown in FIG. 2, surface region 38 is typically about 10 percent of the area of the face 40 of the cell 21, with rear electrode 37 having an area approximately equal to that of front electrode 35.

The face of a photovoltaic cell is the surface on which radiation converted to electricity in the cell is incident. In the cell 21 shown in FIG. 2, radiation is incident on the cell 21 on face 40.

Protective coating 39 is formed on the face 40 of the cell 21 and the rear surface 13 of the substrate 11 in order to protect the cell 21 from degradation arising from exposure to the environment. Such encapsulation is well-known in the art, and in some cases, cover plates (not shown in FIG. 2) may be used.

While not shown in FIG. 2, it will be obvious to one skilled in the art that additional component cells can be formed over component cell 22 using techniques well-known in the art.

Figure 3:
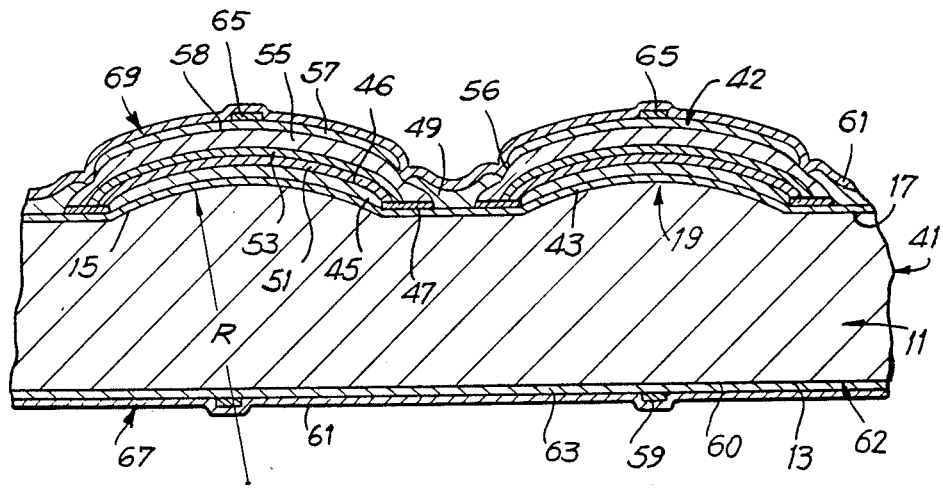
FIG. 3 is an enlarged view in section of a portion of a monolithic multijunction photovoltaic cell formed on a crystal substrate.

In FIG. 3, an enlarged view in section is shown of a portion of a monolithic multijunction photovoltaic cell 41 formed on crystal substrate 11 shown in FIG. 1. The monolithic multijunction photovoltaic cell 41 incorporates component cell 42 and component cell 62.

In the embodiment of the present invention shown in FIG. 3, component cell 62 is composed of the same type of crystal material as is the crystal substrate 11, and component cell 42 incorporates crystal material having a larger value of lattice constant than the crystal material of the substrate.

Component cell 62 has a junction 60 formed by layer 63 on the substrate, where the conductivity type of the substrate and layer 63 are opposite in the sense of p-type versus n-type. The thickness of layer 63 may lie, typically, in the range 0.1–0.5 micrometers, although values outside this range may be used in particular cases. Typical dopant concentrations in layer 63 are in the range $10^{19}$–$2 \times 10^{19}$ cm$^{-3}$, and typical dopant concentrations in the substrate are in the range $10^{16}$–$2 \times 10^{17}$ cm$^{31\ 3}$, although values outside these ranges may be used in particular cases. The thickness of the substrate may be in the range 150–250 micrometers in typical cases, although values outside this range may be used if desired.

Layer 43 is formed on the second side 19 of the substrate 11 of material having the same conductivity type as the substrate 11 but with a dopant concentration in the range $10^{18}$–$2 \times 10^{18}$ cm$^{-3}$ in typical cases. The purpose of layer 43 is to produce a back surface field in component cell 62 so as to reflect minority charge carriers moving towards layer 43 back towards junction 60 of the component cell 62. Typically, layer 43 has a thickness in the range 0.3–1.0 micrometers, although values outside this range can be used for layer 43.

A thin, e.g., 0.1–0.4 micrometers thick, layer 47 of SiO$_2$ is then formed on the flat regions 17 in order to inhibit nucleation of material, and such material as does nucleate on layer 47 will be assumed to have been selectively removed, as previously described.

A lattice-graded epilayer 45 is then grown on convex-shaped regions 15, starting with an initial compatible value on the side of layer 45 which is proximate to convex-shaped regions and grading the lattice constant in magnitude to a final compatible value larger than the initial compatible value on the side of the layer which is proximate to component cell 42. Preferably, layer 45 is composed of intrinsic material although it may be doped in particular cases. Those conditions governing the thickness of layer 45 have been previously described.

In succession, epilayer 51 is grown over layer 45, epilayer 53 is grown over layer 51, epilayer 55 is grown over layer 53, and epilayer 57 is grown over a portion of layer 55 while leaving surface region 56 exposed.

Epilayer 45 has been graded to a final compatible value so that epilayer 51 can be grown over surface 46 while maintaining good crystal quality. Some doping of layer 51 may result from the diffusion of material into this layer from the underlying layer 45. The thickness of layer 51 may lie in the range 0.5–3 micrometers, although its thickness may be outside this range if desired in particular cases. The type of doping of layer 51 is not important to the functioning of component cell 42 although it is often convenient and somewhat preferable if it is doped to the same type of conductivity as layer 53.

Layer 53 may have a thickness in the range 0.3–1.0 micrometers in typical cases, although its thickness may lie outside this range if desired. The function of layer 53 is to create a back surface field in component cell 42 so as to reflect minority charge carriers back towards junction 58 of component cell 42. The composition of epilayer 53 is, preferably, such that it has a larger value of energy bandgap than layer 55 and, if possible, with a higher concentration of dopants than layer 55 in order to develop an effective back surface field in component cell 42, as is well-known in the art. Layer 53 is doped to have the same type of conductivity as layer 55 in the sense of p-type or n-type.

Epilayer 55 may be composed of material having a dopant concentration in the range $10^{16}$–$2\times10^{17}$ cm$^{-3}$, and epilayer 57 may be composed of material having a dopant concentration in the range $10^{19}$–$2\times10^{19}$ cm$^{-3}$ although dopant concentrations outside these ranges can be used in particular cases. The thickness of layer 55 may be in the range 3–6 micrometers and that of layer 57 may lie in the range 0.1–0.5 micrometers although values outside of these ranges may be used in particular cases.

Some lateral overgrowth of layer 47 will typically occur during the formation of component cell 42. Such overgrowth is desirable since it tends to increase the area of layer 57, i.e., the effective area of component cell 42.

A portion of layer 47 down to layer 43 is then removed so that rear electrode 49 can be formed in electrical contact with layer 43 as well as in electrical contact with layer 55. That is, rear electrode 49 is the rear electrode for both component cell 42 and component cell 62. Rear electrode 49 contacts layer 55 on a portion of exposed surface region 56 so that it is not in contact with layer 57.

Front electrode 65 is formed in contact with about 7 percent of layer 57 and front electrode 59 is formed contacting about 7 percent of layer 63. Front electrode 65 is the front electrode of component cell 42, and front electrode 59 is the front electrode of component cell 62.

Protective layer 61 is formed on face 69 of cell 41 over component cell 42 and on face 67 of cell 41 over component cell 62 in order to protect the cell from degradation arising from exposure to the environment. Additional encapsulation of cell 41 may be utilized if desired. Encapsulation materials and techniques are well-known in the art.

While not shown in FIG. 3, antireflection coatings may be formed on the faces 67 and 69 of the cell 41 in order to minimize undesired reflections which would lower cell efficiency. Antireflection coatings are well-known in the art.

Component cell 42 and component cell 62 can be operated in series electrically with each other or not in series electrically with each other. Preferably, however, these component cells are not operated in series optically with each other, although it is possible to operate them in series optically if desired.

If component cells 42 and 62 are not operated in series with each other electrically, then the electrical outputs of cell 41 are taken from front electrode 65 and rear electrode 49 and from front electrode 59 and rear electrode 49. Typically, these outputs are then fed into voltage conditioning equipment (not shown in FIG. 3) which matches the outputs of the component cells to the requirements of the load. Typically, the cost of such voltage equipment is greater when it must handle three-terminal cells than when it must handle two-terminal cells, however. Therefore, for this reason, it may be preferable to connect component cell 62 electrically in series with component cell 42.

If component cell 42 and component cell 62 are operated in series electrically, the the output of cell 41 would be taken at front electrode 65 and front electrode 59, i.e., the cell 41 would be a two-terminal device.

It is usually preferable to operate cell 41 with first radiation (not shown in FIG. 3) incident on face 67 and second radiation (not shown in FIG. 3) incident on face 69, i.e., with the two component cells 42 and 62 not in series optically with each other, when the lattice-grading epilayer 45 is composed of material which absorbs radiation strongly since such absorption would degrade the efficiency of the cell 41.

If the component cells are operated in series electrically but not in series optically, then it is possible to adjust the relative intensities and wavelength regions (which may overlap) of the first radiation and the second radiation so that the photocurrents generated by the first radiation in component cell 42 in the absence of electrical connection to component cell 62 is equal to the photocurrent generated in component cell 62 by the second radiation in the absence of such electrical connection.

For the purposes of the present application, the convention will be adopted that when two or more component cells are connected so that they are electrically in series and the photocurrents generated in these component cells by radiations incident on these component cells are mentioned it is to be explicitly understood that what is meant by such photocurrents are the photocurrents that would be generated in the individual component cells by such radiations if they were not connected electrically in series with each other.

When component cell 42 is operated electrically in series with component cell 62, the photocurrent generated in component cell 42 should not differ by more than 25 percent in magnitude from the photocurrent generated in component cell 62 by first radiation and second radiation, respectively, or the overall conversion efficiency of cell 41 will be excessively degraded. In general, this overall conversion efficiency of cell 41 will be maximized if these photocurrents are equal when the component cells 42 and 62 are operated electrically in series.

Figure 4:
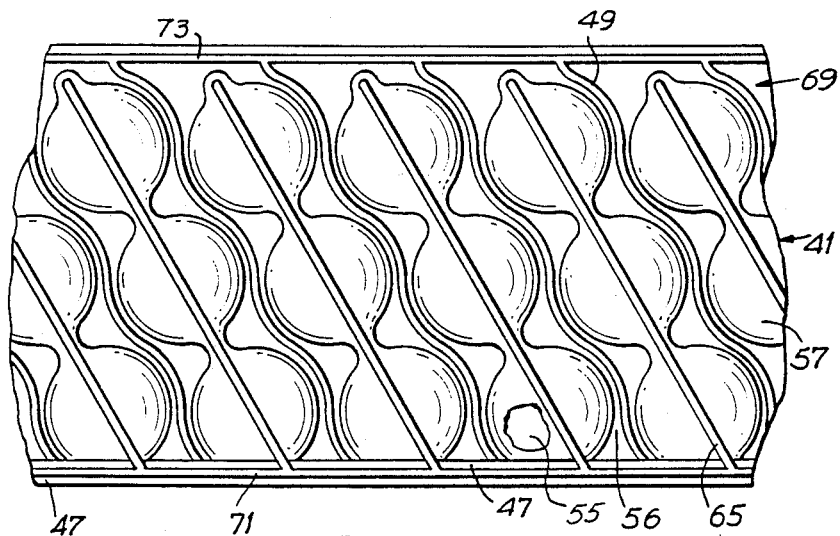
FIG. 4 is a view of a face of one of the component cells of the monolithic multijunction photovoltaic cell shown in FIG. 3 in section.

In FIG. 4, face 69 of the monolithic multijunction photovoltaic cell 41 shown in section in FIG. 3 is shown prior to the encapsulation of the cell 41 by protective layer 61.

Front electrode 65 contacts layer 57 and rear electrode 49 contacts layer 55 in exposed surface region 56. Front electrode 65 is connected to bus 71, and rear electrode 49 is connected to bus 73. Bus 71 is formed on a region of layer 47 where layers 55 and 57 have been removed from layer 47, and bus 73 is formed on a portion of surface region 56 of layer 55 (shown in section in FIG. 3). External connections (not shown in FIG. 4) are made to bus 71 and 73 if component cell 42 is not operated in series electrically with component cell 62, and one of the external connections is made to bus 71 if the component cells 42 and 62 are operated electrically in series (cell 62 is shown in FIG. 3).

Figure 5:
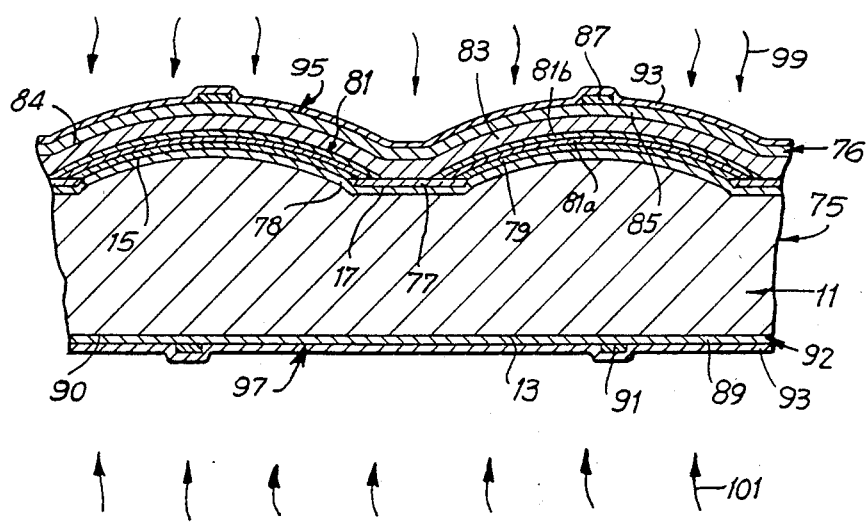
FIG. 5 is an enlarged view in section of a portion of a monolithic multijunction photovoltaic cell differing from the cell shown in FIGS. 3 and 4.

In FIG. 5, an enlarged view in section is shown of a portions of a monolithic multijunction photovoltaic cell 75 which differs in construction from the monolithic multijunction photovoltaic cell shown in FIGS. 3 and 4.

Photovoltaic cell 75 has been formed on the crystal substrate 11 shown in FIG. 1. For the purposes of discussing the embodiment of the present invention shown in FIG. 5, it will be assumed that the substrate 11 is composed of p-type material. However, it will be obvious to one skilled in the art that the substrate could have been composed of n-type material if appropriate changes were made in the conductivity types of the other portions of the cell 75.

Layer 78 composed of p-type material, typically the same type of material that the substrate is composed of, is formed at flat regions 17 and convex-shaped regions 15 of the substrate, but is more heavily doped than the substrate in order to form a back surface field in component cell 92 which reflects minority carriers towards the junction 90 of the component cell 92.

Convex-shaped regions 15 have been used since it is assumed that the lattice constant of crystal materials incorporated in component cell 76 have a larger value of lattice constant than does the material of the crystal substrate 11. However, if the contrary were the case, then the curved-surface regions on which lattice-grading would take place would have been concave-shaped regions rather than the convex-shaped regions 15 shown in FIG. 5, as is disclosed in U.S. Pat. No. 4,548,658.

A thin, e.g., 0.1-0.4 micrometers thick, layer 77 of silicon dioxide is formed on flat regions 17 of the substrate. It is assumed that material will not nucleate on layer 77 during subsequent growth process and that such material as may in fact nucleate on layer 77 has been removed. Techniques well-known in the art can be used to remove such nucleated material. For example, photolithographic techniques and etchants can be used for this purpose.

A lattice-graded epilayer 79 is then grown over layer 78 on the convex-shaped regions 15. During the growth of layer 79, the lattice constant is increased from an initial compatible value to a final compatible value. That is, the growth of layer 79 is commenced with material having a lattice constant such that good crystal quality is preserved, and the growth is completed with a final compatible value of lattice constant such that the crystal material of which epilayer 81a is composed can be grown over the lattice-graded epilayer 79 while preserving good crystal quality.

Layer 79 is composed of material of the same conductivity type as the substrate. If the substrate is composed of p-type material, then layer 79 is composed of p-type material. The dopant concentration in layer 79 may be similar to that of the substrate 11.

Tunnel junction 81 is composed of epilayer 81a and epilayer 81b. Epilayer 81a is composed of p+-type material with a concentration of p-type dopants in the range $10^{19}$–$2 \times 10^{19}$ cm$^{-3}$, and epilayer 81b is composed of n+-type material with a concentration of n-type dopants in the range $10^{19}$–$2 \times 10^{19}$ cm$^{-3}$, although in particular cases the concentrations of dopants in epilayers 81a and 81b may lie outside these ranges, as is well-known in the art. The purpose of the tunnel junction is to provide a low-ohmic resistance electrical connection between component cell 92 and component cell 76.

Epilayer 83 is grown over the tunnel junction 81. Layer 83 is composed of n-type material with a typical dopant concentration in the range $5 \times 10^{16}$–$10^{17}$ cm$^{-3}$, although values outside this range may be used in particular cases. Layer 83 may have a thickness in the range 2-8 micrometers, although values outside this range may be used in particular cases. Some lateral overgrowth of layer 77 by layer 83 will typically occur. Such overgrowth may be desirable in that it will tend to increase the active area of component cell 76.

A thin, e.g., 0.1-0.5 micrometer thick, epilayer 85 of p+-type semiconductor material is then grown over layer 83, thus forming junction 84. The concentration of p-type dopants in layer 85 may lie in the range $10^{19}$–$2 \times 10^{19}$ cm$^{-3}$, although it may lie outside this range in particular cases.

While not shown in FIG. 5, an epilayer of n+-type material may be grown, if desired, between epilayers 81b and 83 of material with a larger energy bandgap value than that of the materials of which epilayer 83 is composed and with a higher concentration of n-type dopants in order to form a back surface field in component cell 76 to reflect minority charge carriers moving in layer 83 towards junction 84.

Layer 89 is then formed at surface 13 of the substrate 11, thereby forming junction 90 of component cell 92. Layer 89 is composed of n+-type material with a concentration of n-type dopants which may lie in the range $10^{19}$–$2 \times 10^{19}$ cm$^{-3}$ although values outside this range may be used in particular cases. The thickness of layer 89 may lie in the range 0.1-0.5 micrometers although values outside this range may be used in particular cases, if desired. The material of which layer 89 is composed may be the same material except for dopants of which the substrate is composed, or may differ in composition.

Front electrode 91 is formed over layer 89 and front electrode 87 is formed over layer 85. Typically, front electrodes cover approximately 7 percent of the area of the layers they contact. Techniques for forming electrodes are well-known in the art.

Protective coating 93 is formed over face 97 and face 95 of the monolithic multijunction photovoltaic cell 75 in order to protect the cell from degradation due to exposure to the environment. If desired, the cells may be further encapsulated using materials and techniques well-known in the art.

The monolithic multijunction cell 75 is a two-terminal device. External electrical connections are made to the front electrodes, as is obvious to one skilled in the art.

Incident radiation is divided into first radiation 101 incident on face 97 and second radiation 99 incident on face 95 of the monolithic cell 75. The means employed to divide the incident radiation and to direct the first and second radiations is not shown in FIG. 5. The division of the incident radiation is, preferably, made in such a manner that the photocurrents generated in component cells 76 and 92 do not differ significantly in magnitude from each other in order to avoid significant loss in the efficiency of the cell 75. However, a difference in the magnitudes of such photocurrents may be acceptable if it is less than 25 percent in particular cases. In the foregoing, the convention previously established for the discussion of photocurrents generated in component cells that are connected in series electrically has been used since the tunnel junction provides such an electrical connection. That is, those photocurrents mentioned for cell 75 are the photocurrents that would be generated in component cells 76 and 92 if they were not electrically connected to each other.

Figure 6:
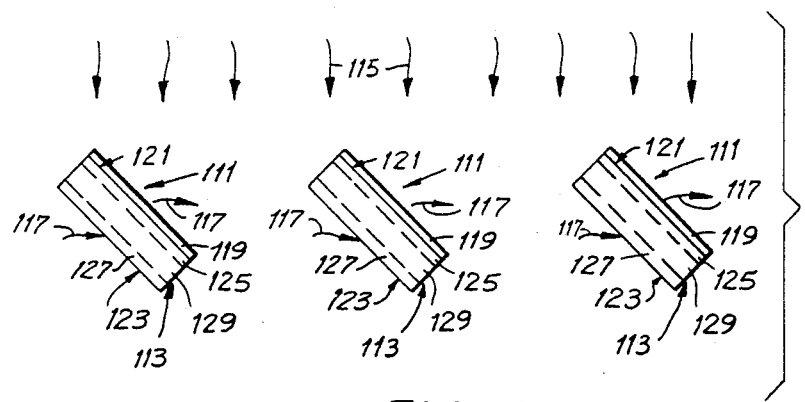
FIG. 6 is a schematic representation of a portion of an array of monolithic multijunction photovoltaic cells.

In FIG. 6, a schematic representation is shown of a portion of an array 111 incorporating monolithic multijunction photovoltaic cells 113. Each monolithic cell 113 incorporates a lattice-graded epilayer 129 which separates first component cell 125 and second component cell 127. The cells 113 are shown in FIG. 6 with flat faces 121 and 123 due to the scale used in FIG. 6. However, it is to be understood that the lattice-graded epilayer 129 has been grown over a plurality of curved-surface regions which are not shown in FIG. 6, and that therefore at least one of the faces 121 or 123 will not be flat if viewed using an appropriate scale.

Typically, layer 129 incorporates material which absorbs radiation strongly in regions of the spectrum of importance for the component cells 125 and 127. Thus, the component cells 125 and 127 are not operated in series optically with each other.

A spectrum-splitting mirror 119 is formed on each face 121 of the cells 113. Techniques for forming a spectrum-splitting mirror (sometimes called a "spectrum-splitting filter") are well-known in the art. For example, a spectrum-splitting mirror can be formed by depositing dichroic layers with alternating values of indices of refraction in periodic succession on a surface. (The reflectivity of such a mirror for light of a given wavelength is a maximum when the optical path in the mirror is a periodic succession of integral numbers of half-wavelengths, and is a minimum when it is a periodic succession of odd integral numbers of quarter-wavelengths.)

Radiation 115 incident on a spectrum-splitting mirror 119 is partially reflected to form radiation 117 and in part passes through the mirror to the underlying component cell 125. The reflected radiation 117 is incident on face 123 of an adjacent cell 113 of the array 111, and passes through this face 123 to the underlying component cell 127.

The reflectivity of the spectrum-splitting mirror 119 as a function of radiation wavelength may be established for given incident radiation 115 so as to produce equal photocurrents in component cells 125 and 127 when these component cells are connected electrically in series with each other. If the component cells are not connected in series electrically with each other, then the division of the incident radiation 115 would be made in such a manner as to optimize the output efficiency of cells 113.

The array 111 shown in FIG. 6, by forming the spectrum-splitting mirrors 119 on the faces 121 of the cells 113, achieves a lower cost than if separate substrates were used for these mirrors.

Figure 7:
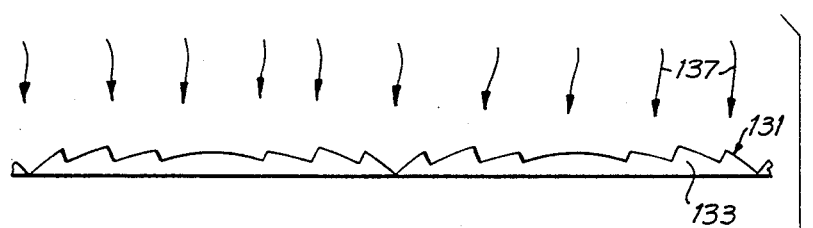
FIG. 7 is a schematic representation of a system incorporating an array of monolithic multijunction photovoltaic cells and a concentrator of radiation.
Figure 7:
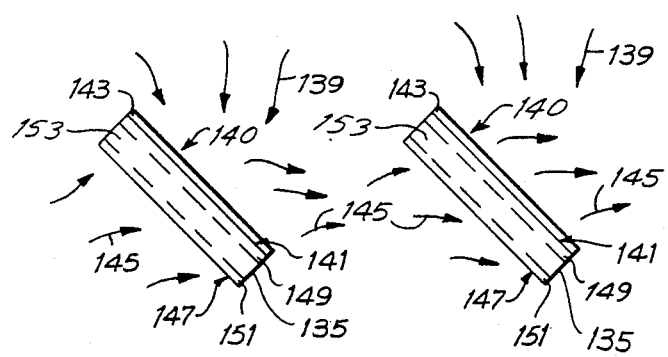

In FIG. 7, a schematic representation is shown of a portion of a concentrator system 131 which incorporates monolithic multijunction photovoltaic cells 135. Each monolithic multijunction photovoltaic cell 135 in the system 131 incorporates a lattice-graded epilayer 153 which is disposed between first component cell 149 and second component cell 151. The cells 135 form an array 140. The cells 135 are shown in FIG. 7 with flat faces 141 and 147 due to the scale used in FIG. 7. However, it is to be understood that the lattice-graded layer 153 has been formed over a plurality of curved-surface regions which are not shown in FIG. 7, and that therefore at least one of faces 141 and 147 would not appear flat if viewed using an appropriate scale.

Typically, layer 153 incorporates material which absorbs radiation strongly in regions of the spectrum of importance for the component cells 151 and 149. Thus, the component cells 151 and 149 are not operated in series with each other optically.

Spectrum-splitting mirrors 143 are formed on faces 141 of the cells 135. Radiation 137 incident on concentrator 133 is concentrated to form radiation 139. Concentrators are well-known in the art. For example, a Fresnel lens can be used to concentate incident radiation 137.

Radiation 139 is incident on the spectrum-splitting mirrors 143 where it is in part passed through to the underlying component cell 149 and is in part reflected to form radiation 145. The radiation 145 reflected from the spectrum-splitting mirror 143 formed on a given one of cells 135 is directed to incidence by the mirror on the face 147 of an adjacent one of cells 135 to the given cell 135. Radiation 145 incident on face 147 of one of cells 135 passes through to the underlying component cell 151.

Depending on the details of their construction, the electrical connections made to them, and the mode of operation used, cells 135 may be operated as two-terminal cells or as cells with three or more terminals.

The details of the electrical connections made to the photovoltaic cells disclosed in the present application have not been shown in the drawing or described in detail. However, such electrical connections to photovoltaic cells are well-known in the art.

It is also well-known in the art that the absorption of radiation in photovoltaic cells which results in the generation of electron-hole pairs which are subsequently separated at a junction of the cells to form photocurrents occur in semiconductor materials.

Although the invention has been described with reference to particular embodiments, it is to be understood that these embodiments are merely illustrative of the principles of the invention. Numerous modifications may be made and other arrangements may be devised without departing from the spirit and the scope of the invention.

I claim:

1. A photovoltaic cell comprising a crystal substrate composed of material having a structure belonging to the cubic crystal system, said crystal substrate having on one surface thereof an ordered plurality of convex-shaped regions, at least one component photovoltaic cell incorporating crystal material having a structure belonging to the cubic crystal system, said crystal material which said at least one component photovoltaic cell incorporates having a lattice constant larger in magnitude than the lattice constant of the material of which said crystal substrate is composed, and a layer of crystal material having a structure belonging to the cubic crystal system disposed between said one crystal substrate surface and said at least one component photovoltaic cell, said crystal material of which said layer is composed having a lattice constant which is graded in magnitude from an initial compatible value on the side of said layer which is proximate to said one crystal substrate surface to a final compatible value larger than said initial compatible value on the side of said layer which is proximate to said at least one component photovoltaic cell.

2. The photovoltaic cell of claim 1 wherein said at least one component photovoltaic cell includes first and second component photovoltaic cells each incorporating crystal material having a structure belonging to the cubic crystal system.

3. The photovoltaic cell of claim 2 wherein said layer is disposed between said first component photovoltaic cell and said second component photovoltaic cell.

4. The photovoltaic cell of claim 3 wherein a first face of said photovoltaic cell transmits first radiation incident thereon to said first component photovoltaic cell and a second face of said photovoltaic cell transmits second radiation incident thereon to said second component photovoltaic cell, said first face being a different face of said photovoltaic cell than said second face.

5. The photovoltaic cell of claim 4 wherein each of said first and second component photovoltaic cells has a rear electrode and the rear electrodes are electrically connected.

6. The photovoltaic cell of claim 5 further including a spectrum-splitting mirror formed on one face thereof.

7. The photovoltaic cell of claim 6 wherein said first component photovoltaic cell is connected electrically in series with said second component photovoltaic cell.

8. The photovoltaic cell of claim 5 wherein said first component photovoltaic cell is connected electrically in series with said second component photovoltaic cell.

9. The photovoltaic cell of claim 4 further including means for dividing radiation into said first radiation and said second radiation.

10. The photovoltaic cell of claim 9 wherein said first component photovoltaic cell is connected electrically in series with said second component photovoltaic cell.

11. The photovoltaic cell of claim 10 wherein said first radiation generates a photocurrent in said first component photovoltaic cell which has a magnitude that does not differ by more than 25 percent from the magnitude of the photocurrent generated in said second component photovoltaic cell by said second radiation.

12. A photovoltaic cell comprising a substrate composed of crystal material having a structure belonging to the cubic crystal system, said substrate having on one surface thereof an ordered plurality of curved-surface regions, at least one component photovoltaic cell which incorporates crystal material also having a structure belonging to the cubic crystal system, said crystal material which said at least one component photovoltaic cell incorporates having a lattice constant different in magnitude from the lattice constant of the crystal material of which said substrate is composed, and a layer of crystal material having a structure belonging to the cubic crystal system disposed between said one substrate surface and said at least one component photovoltaic cell, said crystal material of which said layer is composed having a lattice constant which is graded in magnitude from an initial compatible value on the side of said layer which is proximate to said one substrate surface to a final compatible value different from said initial compatible value on the side of said layer which is proximate to said at least one component photovoltaic cell.

13. The photovoltaic cell of claim 12 wherein said at least one component photovoltaic cell includes first and second component photovoltaic cells each incorporating crystal material having a structure belonging to the cubic crystal system.

14. The photovoltaic cell of claim 13 wherein said layer is disposed between said first component photovoltaic cell and said second component photovoltaic cell.

15. The photovoltaic cell of claim 14 wherein a first face of said photovoltaic cell transmits first radiation incident thereon to said first component photovoltaic cell ahd a second face of said photovoltaic cell transmits second radiation incident thereon to said second component photovoltaic cell, said first face being a different face of said photovoltaic cell than said second face.

16. The photovoltaic cell of claim 15 wherein each of said first and second component photovoltaic cells has a rear electrode and the rear electrodes are electrically connected.

17. The photovoltaic cell of claim 16 further including a spectrum-splitting mirror formed on one face thereof.

18. The photovoltaic cell of claim 15 wherein said first component photovoltaic cell is connected electrically in series with said second component photovoltaic cell.

19. The photovoltaic cell of claim 18 further including a spectrum-splitting mirror formed on one face thereof.

20. The photovoltaic cell of claim 15 further including means for dividing radiation into said first radiation and said second radiation.

21. The photovoltaic cell of claim 20 wherein said first radiation generates a photocurrent in said first component photovoltaic cell which has a magnitude that does not differ by more than 25 percent from the magnitude of the photocurrent generated in said second component photovoltaic cell by said second radiation.

22. An array of monolithic multijunction photovoltaic cells comprising a plurality of monolithic multijunction photovoltaic cells each of which has first and second faces and each of which has first and second component photovoltaic cells responsive to a respective one of first and second ranges of radiation wavelengths; and means for dividing incident radiation into first radiation with wavelengths in the first range of radiation wavelengths and second radiation with wavelengths in the second range of radiation wavelengths, directing the first radiation to the first faces, and directing the second radiation to the second faces.

23. The array of claim 22 wherein said dividing and directing means include spectrum-splitting mirrors each of which is formed on the first face of one of said plurality of monolithic multijunction photovoltaic cells.

24. The array of claim 23 wherein each of said spectrum-splitting mirrors allows the first radiation which is incident thereon to pass through the respective first face to the respective underlying first component photovoltaic cell and reflects second radiation which is incident thereon to the second face of a different one of said plurality of monolithic multijunction photovoltaic cells, said second face allowing the second radiation which is incident thereon to pass through to the respective underlying second component photovoltaic cell.

25. The array of claim 24 wherein the first and second component photovoltaic cells of each monolithic multijunction photovoltaic cell of the array generate photocurrents which differ from each other by no more than 25 percent and said first and second component photovoltaic cells are electrically in series with each other.

26. The array of claim 22 wherein the first and second component photovoltaic cells of each monolithic multijunction photovoltaic cell of the array generate photocurrents which differ from each other by no more than 25 percent and said first and second component photovoltaic cells are electrically in series with each other.

27. The array of claim 22 wherein each of said monolithic multijunction photovoltaic cells comprises a crystal substrate composed of material having a structure belonging to the cubic crystal system, said crystal substrate having on one surface thereof an ordered plurality of curved-surface regions, and wherein said first and second component photovoltaic cells each incorporate crystal material having a structure belonging to the cubic crystal system, the crystal material which at least one of said first and second component photovoltaic cells incorporates having a lattice constant different from the lattice constant of the material of which said crystal substrate is composed, and further including a layer of crystal material having a structure belonging to the cubic crystal system disposed between said one crystal substrate surface and said at least one of said first and second component photovoltaic cells, said crystal material of which layer is composed having a lattice constant which is graded in magnitude from an initial compatible value on the side of said layer which is proximate to said one crystal substrate surface to a final compatible value on the side of said layer which is proximate to said at least one of said first and second component photovoltaic cells.

28. The array of claim 27 wherein the first and second component photovoltaic cells of each monolithic multijunction photovoltaic cell of the array generate photocurrents which differ from each other by no more than 25 percent and said first and second component photovoltaic cells are electrically in series with each other.

29. The array of claim 28 wherein said dividing and directing means include spectrum-splitting mirrors each of which is formed on the first face of each of said plurality of monolithic multijunction photovoltaic cells.

30. The array of claim 29 further including means for concentrating radiation on said spectrum-splitting mirrors.

31. The array of claim 27 further including means for concentrating radiation on said monolithic multijunction photovoltaic cells.

32. The array of claim 22 further including means for concentrating radiation on said means for dividing incident radiation.

* * * * *